United States Patent [19]

Barr

[11] Patent Number: 4,739,214

[45] Date of Patent: Apr. 19, 1988

[54] DYNAMIC ELECTRON EMITTER

[75] Inventor: Robert W. Barr, Alexandria, Va.

[73] Assignee: Anatech Ltd., Alexandria, Va.

[21] Appl. No.: 930,245

[22] Filed: Nov. 13, 1986

[51] Int. Cl.$^4$ .......................... H05H 1/34; H01J 27/02
[52] U.S. Cl. ............................... 313/362.1; 250/423 R;
 315/111.81
[58] Field of Search ............. 313/362.1, 361.1, 231.31,
 313/230; 250/423 R, 423 F; 315/111.41,
 111.81, 111.91

[56] References Cited

U.S. PATENT DOCUMENTS 4,339,691 7/1982 Morimiya et al. ............. 315/111.21
4,602,161 7/1986 Whealton et al. .............. 250/423 R
4,707,637 11/1987 Harvey ........................... 315/111.81

Primary Examiner—David K. Moore
Assistant Examiner—Sandra L. O'Shea
Attorney, Agent, or Firm—Scrivener and Clarke

[57] ABSTRACT

A dynamic electron emitter includes a cold cathode in a cathode chamber emitting electrons in a focussed beam at and through a small orifice into a receiving chamber containing an anode and which may be the chamber of an ion gun. The orifice size is critical in that it must be small enough to ensure a higher pressure in the cathode than in the receiving chamber yet large enough to pass therethrough a sufficiently large flux of electrons to accomplish the intended purpose of the electron stream.

5 Claims, 1 Drawing Sheet

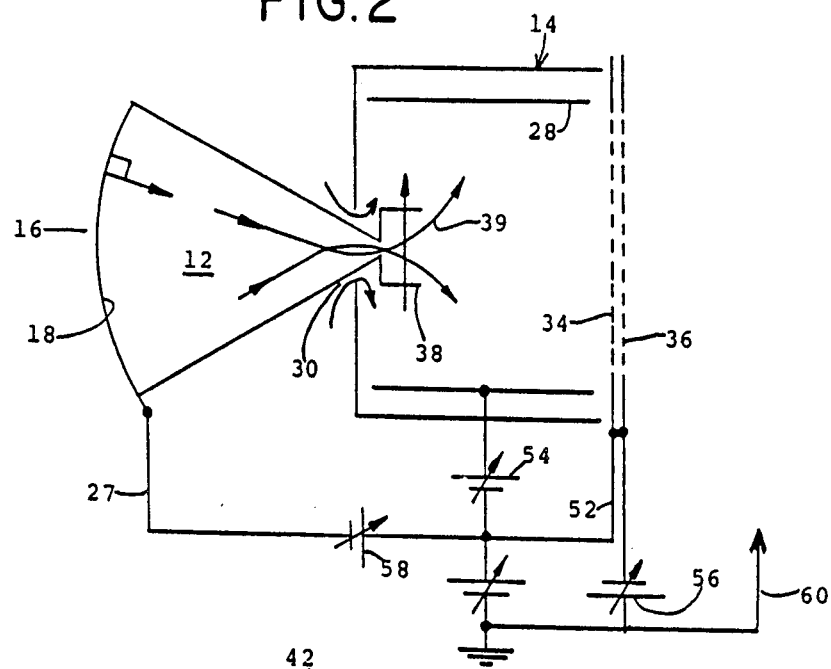
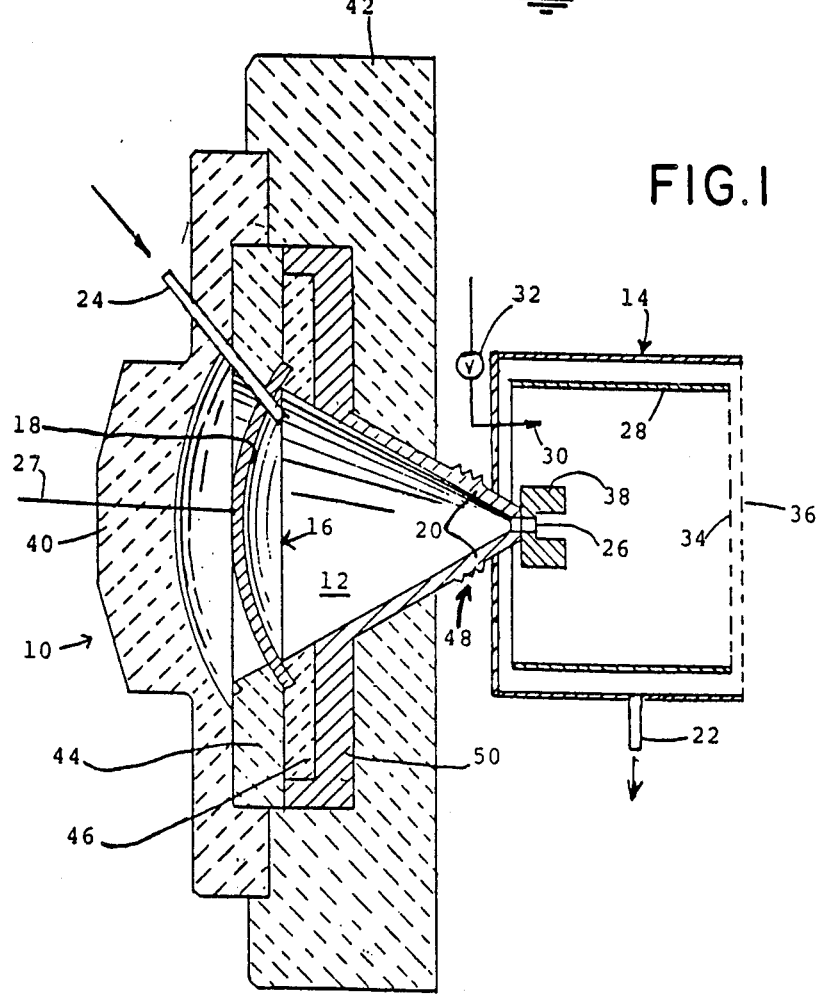

DYNAMIC ELECTRON EMITTER

This invention relates to electron emitters and particularly to dynamic electron emitters of the cold cathode variety.

BACKGROUND OF THE INVENTION

Cold cathode electron emission techniques in soft vacuum are presently used to perform precision electron welding. Other researchers have produced ion beams of low divergence and good intensity using a saddle field electron configuration in the plasma chamber, a cold cathode technique, without the use of extraction grids or multiple power supplies. These applications indicated that such a technique should be capable of sourcing electrons in sufficient quantity to support strong ionization of argon and other gases.

A cold cathode source is preferable to a thermionic electron emitter in a reactive atmosphere since there are no hot filaments which are subject to chemical attack and failure. An additional benefit in having no hot elements in the device allows a more diverse selection of materials of construction. Other ion beam applications which do not involve reactive chemicals profit as well, since filaments are always subject to sputter erosion and finite lifetimes.

SUMMARY OF THE INVENTION

The invention is shown and described in its use as an electron source for an ion gun. It is, however, not limited to such use but may be used wherever a source of electrons is required. The invention comprises a cathode in the dynamic electron source chamber constructed in accordance with the invention and a receiver chamber, which may be an ion gun. Both chambers are evacuated, preferably by the same vacuum system which evacuates the receiving chamber. The cathode chamber is then flooded with a gas, preferably helium. A different gas is admitted to the receiving chamber, preferably argon in an ion gun. Reactive gases may also be used where the process is required. A plasma is then formed within the cathode chamber, this plasma being initiated and sustained by the potential which exists between an anode in the receiving chamber and the cathode. Where the gas is helium the plasma consists of positive helium ions and electrons. The walls of the cathode chamber are themselves made from a machinable ceramic such as aluminum silicate, which limits recombination of the electrons, hence enhancing electron transport to the exit orifice. Some of these electrons are emitted normal to the cathode surface which is a sector of a sphere to form a focused beam of electrons having its focus at the exit orifice. The exit orifice connects the cathode chamber to the receiving chamber. Because the beam is focused, a small exit orifice is possible, thus preserving a higher pressure in the cathode chamber than in the receiving chamber. Secondary electrons are also formed within the plasma and those with random velocity vectors transported out of the orifice along with the bulk mass flow of gas. Electrons which exit through the orifice pass through a strong transverse magnetic field provided by a magnet surrounding the exit side of the orifice. This bends the electron paths to ensure that a high percentage of the available electrons are forced into rotation trajectories and oscillatory paths, which are necessary should the receiving chamber be an ionization chamber of an ion gun. Typical anode currents of 500 ma. are possible with an anode potential of about 20 v.

The electron source is protected from any reactive gas which may be present in the receiving chamber due to the higher pressure in the cathode chamber thereby precluding contamination in the cathode chamber. Should reactive ions diffuse from the receiving chamber into the cathode chamber these will be pumped out by the mass flow of gas and electrons exiting through the exit orifice, thus rendering the effects of such reactive ions negligible. This permits the fabrication of a cathode having an exceptionally long life.

Hence the principal object of the present invention is to adapt cold cathode electron emission techniques to the sourcing of electrons in sufficient quantity for a variety of purposes, including, but not limited to, supporting strong ionization of argon and other gases.

Other objects and their attendant advantages will become apparent as the following detailed description is read in conjunction with the accompanying drawings wherein:

FIG. 1 is a cross-sectional view of a dynamic electron emitter in accordance with the invention which includes as a part thereof a receiving chamber schematically illustrated as a conventional ion gun chamber; and FIG. 2. is a schematic view of the arrangement of FIG. 1.

DETAILED DESCRIPTION OF THE INVENTION

With reference now to the drawings, the numeral 10 refers broadly to the emitter of the invention which comprises a cathode chamber 12 and a receiver 14 which for purposes of illustrations may be the chamber of a conventional ion gun.

Within the cathode chamber 12 is a cathode 16 having an emitting surface 18 facing an insulated spaced wall part 20 of the cathode chamber. Means are provided for evacuating both of the chambers, as for example, by a pump (not shown) connected to a vacuum fitting 22 through wall of the receiving chamber 14. Means, such as the the inlet pipe 24 shown, is provided for admitting at low pressure an emitting gas, such as helium, into the cathode chamber 12, and orifice means 26 in the insulated spaced wall part 20, which is shown conical for reasons that will be explained, restrict the flow of low pressure gas supplied from the cathode chamber 12 into the receiving chamber 14 so as to maintain the gas pressure in the cathode chamber higher than that in the receiving chamber. Means, represented by the lead wire 27, causes a discharge in the cathode chamber, and anode means, such as the anode 28 shown in the receiving chamber, extract into the receiving chamber through the orifice 26 electrons emitted from the surface 18 of the cathode into the cathode chamber.

In accordance with the invention the emitter surface 18 of the cathode is in the form of a sector of a sphere symmetrically positioned with respect to the orifice 26 with the latter located substantially at the focus of the sector. Also, in accordance with the invention, the wall part 20 is a continuation of a conical wall of the cathode chamber which converges from the emitter surface 18 to the orifice 26. This feature in combination with the focused emitter surface ensures that substantially all emitted electrons are guided to the orifice thus ensuring an effective and strong stream of electrons flowing into the receiving chamber to accomplish the intended purpose, for example, of ionizing a gas in the receiving chamber. Gas may be admitted to the receiving chamber 14 through an inlet fitting 30 controlled by a pressure limiting valve 32 which limits the pressure of the admitted ionizable gas so that it, with the pressure of gas flowing through the orifice 26 into chamber 14, and considering the relatively small size of the orifice is less than the pressure of gas in the cathode chamber.

Where the receiving chamber is an ion gun chamber it may be provided with the conventional screen and accelarator grids 34 and 36. Further, within the chamber 14 is a magnet 38 located adjacent the exit side of the orifice 26 to bend the paths 39 of electrons (FIG. 2) exiting through the orifice into the receiving chamber. This bending is especially important where the receiving chamber is an ion gun because the electrons, due to the swirling or lateral movement imparted thereto by the magnet, impinge on many more gas atoms than they would if the magnet were not provided. Further, it has been demonstrated that without the magnet, the unit experiences a low discharge current and severe heating of the screen grid by axial electron impact.

The cathode chamber 12 is located within a structure comprising a back plate 40 and a front plate 42 which serve as a support and vacuum seal for the cathode. The back plate incorporates the high voltage feedthrough 27 used to supply the cathode potential. Sandwiched between the front and back plates 40, 42 are ceramic mounting members 44, 46 which may be aluminum silicate. The members 44, 46 serve as supports and electrical insulators for the cathode 16. The support 44 overlaps the rear edge part of the cathode to ensure that plasma will not form between the rear of the cathode and the housing back plate. The mounting members also serve as a gas director, spreading gas entering through passage 24 around the cathode boundary, thus creating a high pressure region near the cathode which aids in electron emission.

The cathode may be of any suitable material such as aluminum, tungsten or carbon. In general, however, the cathode may be subject to some sputtering which may be minimized by the use of helium as the gas with the cathode made of tungsten, though other gas/cathode combinations may be appropriate.

As can be seen the cathode chamber 12 itself is defined by the cathode and the conical side wall 20 of a ceramic unit 48, preferably of aluminum silicate, having a shallow hollow flange 50 for receiving the cathode mounting member 46. As previously mentioned the part-spherical cathode and the conical side wall 20 cause focused electrons to converge into a point at the exit orifice 26. The exit orifice size is critical since it determines the pressure differential between the cathode and receiving chambers. However, the orifice must also be large enough to allow a high flux of electrons, yet small enough to limit the gas load from the cathode chamber into the receiving chamber so that a low discharge pressure can be maintained in the receiving chamber, which is necessary where reactive gases are to be introduced into the discharge chamber for ionization. Satisfactory results have been obtained with an orifice size ranging from 0.015 to 0.060 inches diameter and a pressure of about 3 to $5 \times 10^{-3}$ torr in the cathode chamber and of about $5 \times 10^{-4}$ torr in the receiving chamber.

Where the cathode and receiving chambers comprise an ion gun, five power supplies as indicated in FIG. 2 are required: 52 for the screen 34, 54 for the anode 28, 56 for the accelerator 36, 58 for the cathode 16 and 60 leading to a neutralizer (not shown) located in a chamber to the right of the accelerator 36 as well recognized by those skilled in this art, see, for example, the patent to Kaufman et al. U.S. Pat. No. 4,482,062.

For a 5 cm ion source, representative power supply specifications are as follows:

| Anode | 0 to 500 ma, | 0 to 100 volts |
|---|---|---|
| Screen | 0 to 50 ma, | 0 to 5000 volts |
| Accelerator | 0 to 20 ma, | 0 to 1000 volts |
| Cathode | 0 to 600 ma, | 0 to 1000 volts |
| Neutralizer | 0 to 10 amps, | 0 to 15 volts |

Note that FIG. 2 indicates that the anode, screen and accelerator (as well as the neutralizer) supplies are connected as is common practice in existing gun designs. The cathode supply floats down from the screen with its positive terminal referenced from the screen supply. This enforces a fixed potential between the screen and the cathode and makes the cathode emission independent of the screen voltage. These supplies are available from standard power supply set with the addition of a Sorenson laboratory supply and ballast resistor as the cathode power supply. Cathode discharge initiation is brought about by the creation of a small plasma discharge in the cathode chamber which will spread rapidly throughout the chamber once operating voltage and pressure is established.

It should be noted that an emitter constructed in accordance with the invention can, depending on the operating pressure, operate on a power supply of about 45 watts as opposed to a supply of about 450 watts as usually required thermionically to power on an electron supply for a conventional ion gun.

Having now described the invention what is claimed is:

1. A dynamic electron emitter comprising a cathode chamber and a receiving chamber, a cathode in said cathode chamber having an emitting surface facing a spaced insulating wall part of said cathode chamber, means for evacuating both of said chambers, means for admitting an emitting gas at low pressure into said cathode chamber, orifice means in said spaced wall part for restricting the flow of said low pressure gas supplied from said cathode chamber into said receiving chamber such as to maintain the gas pressure in said cathode chamber to be higher than that in said receiving chamber, potential means for causing discharge in said cathode chamber, and anode means for extracting into said receiving chamber through said orifice means electrons in said cathode chamber said emitting surface of said cathode being in the form of a sector of a sphere symmetrically positioned with respect to said orifice means, and said orifice means is located substantially at the focus of said sector.

2. The emitter of claim 1, wherein the cathode chamber has a substantially conical insulated side wall converging from said emitter surface to said orifice means.

3. The emitter of claim 1, including magnet means located adjacent the exit side of said orifice to bend the path of electron exiting through said orifice means into said receiving chamber.

4. The emitter of claim 3, including means for admitting gas for ionization into said receiving chamber, and means for limiting the pressure of said admitted gas so that it with the pressure of gas flowing through said orifice into said receiving chamber is less than the pressure of gas in said cathode chamber.

5. A dynamic electron emitter comprising a cathode chamber and a receiving chamber, a cathode in said cathode chamber having an emitting surface facing a spaced insulating wall part of said cathode chamber, means for evacuating both of said chambers, means for admitting an emitting gas at low pressure into said cathode chamber, orifice means in said spaced wall part for restricting the flow of said low pressure gas supplied from said cathode chamber into said receiving chamber such as to maintain the gas pressure in said cathode chamber to be higher than that in said receiving chamber, an anode on the side of said orifice means opposite said cathode chamber, means for supplying a potential between said anode means and said cathode to initiate and sustain the formation of a plasma in said cathode chamber, said plasma comprising ions of said emitting gas and electrons, said anode also being arranged to extract into said receiving chamber through said orifice means electrons in said cathode chamber said emitting surface of said cathode being in the form of a sector of a sphere symmetrically positioned with respect to said orifice means, and said orifice means is located substantially at the focus of said sector.

* * * * *